US012683586B2

(12) United States Patent
Ding et al.

(10) Patent No.: US 12,683,586 B2
(45) Date of Patent: Jul. 14, 2026

(54) DUTY CYCLE CALIBRATION CIRCUIT AND METHOD, CHIP, AND ELECTRONIC DEVICE

(71) Applicant: AMLOGIC (SHANGHAI) CO., LTD, Shanghai (CN)

(72) Inventors: Jianyu Ding, Shanghai (CN); Yueting Li, Shanghai (CN); Yang Yang, Shanghai (CN); Xu Guo, Shanghai (CN); Yang Liu, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 18/850,316

(22) PCT Filed: Aug. 30, 2022

(86) PCT No.: PCT/CN2022/115949
§ 371 (c)(1),
(2) Date: Sep. 24, 2024

(87) PCT Pub. No.: WO2023/184851
PCT Pub. Date: Oct. 5, 2023

(65) Prior Publication Data
US 2025/0211209 A1 Jun. 26, 2025

(30) Foreign Application Priority Data

Mar. 31, 2022 (CN) .......................... 202210335675.6

(51) Int. Cl.
*H03K 3/017* (2006.01)
*H03K 5/156* (2006.01)
(52) U.S. Cl.
CPC ............. *H03K 3/017* (2013.01); *H03K 5/156* (2013.01)

(58) Field of Classification Search
CPC ...................................................... H03K 3/017
(Continued)

(56) References Cited

U.S. PATENT DOCUMENTS

2014/0009197 A1 * 1/2014 Yasuda .................. H03K 3/017
327/175

FOREIGN PATENT DOCUMENTS

CN        104428994 A        3/2015
CN        104753499 A        7/2015
(Continued)

OTHER PUBLICATIONS

Office Action issued in Chinese Application No. 202111119709.X, dated Jul. 9, 2025.
(Continued)

*Primary Examiner* — Tomi Skibinski
(74) *Attorney, Agent, or Firm* — Knobbe, Martens, Olson & Bear, LLP

(57) ABSTRACT

Provided are a duty cycle calibration circuit and method, a chip, and an electronic device. In the duty cycle calibration circuit, through a counting clock signal having a higher clock signal frequency than a calibration clock signal, a counting unit is configured to acquire a number of counting pulses generated in a high-level state and a low-level state of the calibration clock signal within a preset counting period, so as to obtain an actual duty cycle of the calibration clock signal. Compared with a method of acquiring a duty cycle of a calibration clock signal by comparing the calibration clock signal with a reference clock signal, inaccurate measurement of the duty cycle of the calibration clock signal after the reference clock signal is affected can be overcome. Therefore, accuracy of measurement of the duty cycle can be improved, and precision of calibration of the duty cycle can be improved accordingly.

18 Claims, 4 Drawing Sheets

(58) Field of Classification Search
USPC ........................................................ 327/175
See application file for complete search history.

(56)                 References Cited

FOREIGN PATENT DOCUMENTS

| | | | |
|---|---|---|---|
| CN | 105204992 | A | 12/2015 |
| CN | 108566183 | A | 9/2018 |
| CN | 209496092 | U | 10/2019 |
| CN | 114665848 | A | 6/2022 |
| JP | 2002/005973 | A | 1/2002 |

OTHER PUBLICATIONS

Search Report and Written Opinion received in International Application No. PCT/CN2022/115949, dated Nov. 29, 2022.

* cited by examiner

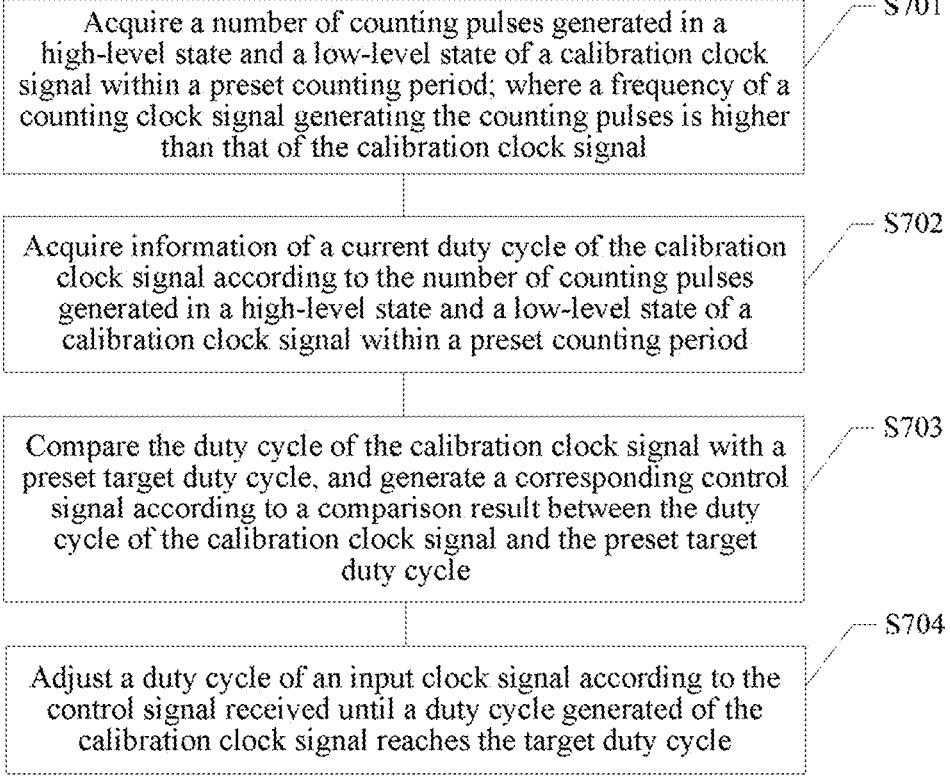

Acquire a number of counting pulses generated in a high-level state and a low-level state of a calibration clock signal within a preset counting period; where a frequency of a counting clock signal generating the counting pulses is higher than that of the calibration clock signal — S701

Acquire information of a current duty cycle of the calibration clock signal according to the number of counting pulses generated in a high-level state and a low-level state of a calibration clock signal within a preset counting period — S702

Compare the duty cycle of the calibration clock signal with a preset target duty cycle, and generate a corresponding control signal according to a comparison result between the duty cycle of the calibration clock signal and the preset target duty cycle — S703

Adjust a duty cycle of an input clock signal according to the control signal received until a duty cycle generated of the calibration clock signal reaches the target duty cycle — S704

FIG. 7

DUTY CYCLE CALIBRATION CIRCUIT AND METHOD, CHIP, AND ELECTRONIC DEVICE

TECHNICAL FIELD

The disclosure relates to the technical field of circuits, and in particular to a duty cycle calibration circuit and method, chip, and electronic device.

BACKGROUND

The concept of duty cycle is applied to a periodic signal only. The duty cycle of the periodic signal is a ratio of duration of a high-level state of the signal to a time length of a clock period. For example, the duty cycle of 50% indicates that the signal is in the high-level state for half of one clock period.

Calibration of the duty cycle is of important value in various high-performance circuit applications, including dynamic logic circuits, analog circuits, arrays, etc., and is especially important in clock source circuits.

Therefore, it is a pressing issue for those skilled in the art to precisely calibrate a duty cycle of a clock signal.

SUMMARY

Technical Problem duty cycle calibration circuit and method, chip, and electronic device are provided in embodiments of the disclosure, so as to improve accuracy of calibration of the duty cycle.

Technical Solution

To resolve the above problem, a duty cycle calibration circuit is provided in an embodiment of the disclosure. The circuit includes:

a counting unit configured to receive a calibration clock signal; and acquire a number of counting pulses generated in a high-level state and a low-level state of the calibration clock signal within a preset counting period; where a frequency of a counting clock signal generating the counting pulses is higher than that of the calibration clock signal;

a control unit configured to receive the number of counting pulses generated in a high-level state and a low-level state of the calibration clock signal within a preset counting period; acquire information of a current duty cycle of the calibration clock signal according to the number of counting pulses generated in a high-level state and a low-level state of the calibration clock signal within a preset counting period; compare the current duty cycle of the calibration clock signal with a preset target duty cycle; and generate a corresponding control signal according to a comparison result between the duty cycle of the calibration clock signal and the target duty cycle; and a duty cycle adjustment unit configured to receive the control signal and an input clock signal; and adjust a duty cycle of the input clock signal according to the control signal received, and acquire a corresponding calibration clock signal until a duty cycle of the calibration clock signal reaches the target duty cycle.

Correspondingly, a chip is further provided in an embodiment of the disclosure. The chip includes any circuit for calibrating a duty cycle described above.

Correspondingly, an electronic device is further provided in an embodiment of the disclosure. The electronic device includes the above chip.

Correspondingly, a duty cycle calibration method is provided an embodiment of the disclosure. The method includes:

acquiring a number of counting pulses generated in a high-level state and a low-level state of a calibration clock signal within a preset counting period; where a frequency of a counting clock signal generating the counting pulses is higher than that of the calibration clock signal;

acquiring information of a current duty cycle of the calibration clock signal according to the number of counting pulses generated in a high-level state and a low-level state of the calibration clock signal within a preset counting period;

comparing the current duty cycle of the calibration clock signal with a preset target duty cycle;

generating a corresponding control signal according to a comparison result between the current duty cycle of the calibration clock signal and the target duty cycle; and adjusting a duty cycle of an input clock signal according to the control signal until a duty cycle of a calibration clock signal generated reaches the target duty cycle.

Beneficial Effect

Compared with the prior art, the technical solutions in the embodiments of the disclosure have the advantages as follows: in the circuit for calibrating a duty cycle according to the embodiment of the disclosure, through the counting clock signal having a higher clock signal frequency than the calibration clock signal, the counting unit is configured to acquire the number of counting pulses generated in a high-level state and a low-level state of a calibration clock signal within a preset counting period, so as to obtain an actual duty cycle of the calibration clock signal. Compared with a method of acquiring a duty cycle of a calibration clock signal by comparing the calibration clock signal with a reference clock signal, inaccurate measurement of the duty cycle of the calibration clock signal after the reference clock signal is affected can be overcome. Therefore, accuracy of measurement of the duty cycle can be improved, and precision of calibration of the duty cycle can be improved accordingly.

BRIEF DESCRIPTION OF THE DRAWINGS

FIG. 7 is a schematic flowchart of a duty cycle calibration method in an embodiment of the disclosure.

DETAILED DESCRIPTION

Figure 1:
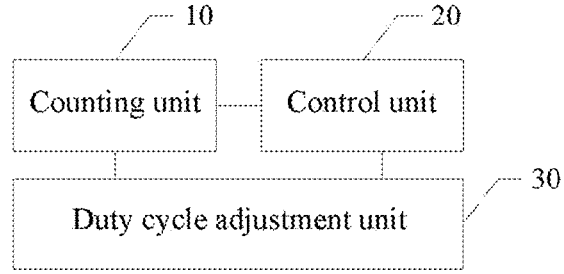
FIG. 1 is a schematic structural diagram of a duty cycle calibration circuit in an embodiment of the disclosure.

An existing duty cycle calibration circuit has inaccurate measurement of the duty cycle, resulting in low precision of calibration of the duty cycle.

Specifically, measurement information of a duty cycle of the calibration clock signal is acquired by comparing the calibration clock signal with a preset reference clock signal. However, when the reference clock signal is affected, measurement of the duty cycle of the calibration clock signal is inaccurate, affecting the precision of calibration of the duty cycle.

To solve the above problem, a duty cycle calibration circuit is provided in an embodiment of the disclosure. The circuit includes: a counting unit configured to receive a calibration clock signal; and acquire a number of counting pulses generated in a high-level state and a low-level state of the calibration clock signal within a preset counting period; where a frequency of a counting clock signal generating the counting pulses is higher than that of the calibration clock signal; a control unit configured to receive the number of counting pulses generated in a high-level state and a low-level state of the calibration clock signal within a preset counting period; acquire information of a current duty cycle of the calibration clock signal according to the number of counting pulses generated in a high-level state and a low-level state of the calibration clock signal within a preset counting period; compare the current duty cycle of the calibration clock signal with a preset target duty cycle; and generate a corresponding control signal according to a comparison result between the current duty cycle of the calibration clock signal and the target duty cycle; and a duty cycle adjustment unit configured to receive the control signal and an input clock signal; and adjust a duty cycle of the input clock signal according to the control signal received, and acquire a corresponding calibration clock signal until a duty cycle of the calibration clock signal reaches the target duty cycle.

In the duty cycle calibration circuit according to the embodiment of the disclosure, through the counting clock signal having a higher clock signal frequency than the calibration clock signal, the counting unit is configured to acquire the number of counting pulses generated in a high-level state and a low-level state of a calibration clock signal within a preset counting period, so as to obtain an actual duty cycle of the calibration clock signal. Compared with a method of acquiring a duty cycle of a calibration clock signal by comparing the calibration clock signal with a reference clock signal, inaccurate measurement of the duty cycle of the calibration clock signal after the reference clock signal is affected can be overcome. Therefore, accuracy of measurement of the duty cycle can be improved, and precision of calibration of the duty cycle can be improved accordingly.

To make the above objectives, features, and advantages of the disclosure more obvious and understandable, specific embodiments of the disclosure are described in detail below with reference to the accompanying drawings.

FIG. 1 is a schematic structural diagram of a duty cycle calibration circuit in an embodiment of the disclosure. With reference to FIG. 1, the duty cycle calibration circuit in the embodiment of the disclosure may include a counting unit 10, a control unit 20, and a duty cycle adjustment unit 30.

The counting unit 10 is coupled to the control unit 20, and the control unit 20 is further coupled to the duty cycle adjustment unit 30.

The counting unit 10 is provided with a first input end, a second input end, a first output end, and a second output end. The first input end of the counting unit 10 is coupled to the duty cycle adjustment unit 30, the second input end of the counting unit 10 is configured to receive a preset counting clock signal, and the first output end and the second output end of the counting unit 10 are coupled to the control unit 20. The counting unit 10 is configured to receive a calibration clock signal output by the duty cycle adjustment unit 30, and acquire a number of counting pulses generated in a high-level state and a low-level state of the calibration clock signal within a preset counting period. A frequency of the counting clock signal generating the counting pulses is higher than that of the calibration clock signal.

Figure 2:
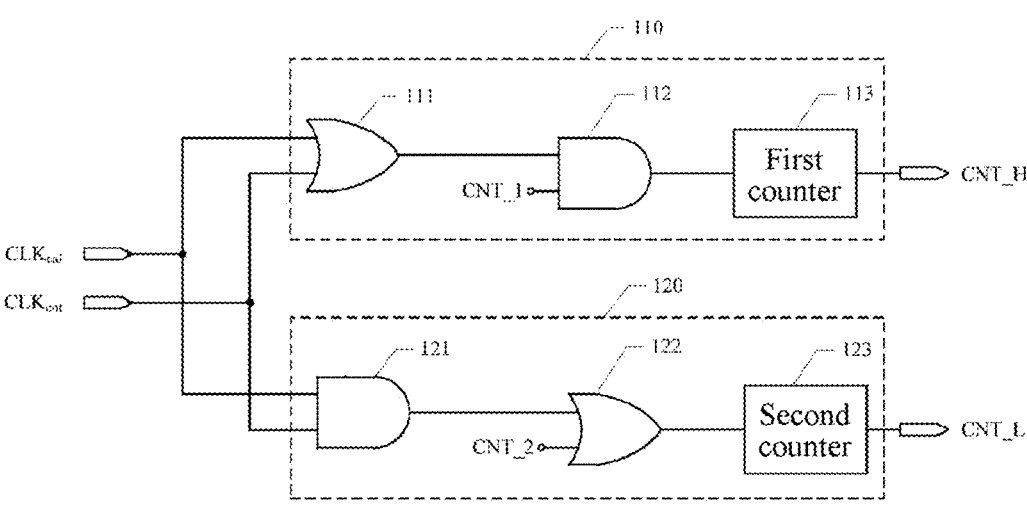
FIG. 2 is a schematic structural diagram of a counting unit in an embodiment of the disclosure.

FIG. 2 is a schematic structural diagram of a counting unit in an embodiment of the disclosure. As shown in FIG. 2, the counting unit includes a first counting module 110 and a second counting module 120.

The first counting module 110 is provided with a first input end, a second input end, and an output end. The first input end of the first counting module 110 serves as a first input end of the counting unit or is coupled to a first input end of the counting unit, and is configured to receive the calibration clock signal ($CLK_{cal}$). The second input end of the first counting module 110 serves as a second input end of the counting unit or is coupled to a second input end of the counting unit, and is configured to receive the counting clock signal ($CLK_{cnt}$). The first counting module 110 is configured to acquire a first number of a counting pulse generated in the high-level state of the calibration clock signal within the preset counting period.

In the embodiment, the first counting module 110 includes a first OR gate 111, a first AND gate 112, and a first counter 113. A first input end of the first OR gate 111 serves as the first input end of the first counting module 110 or is coupled to the first input end of the first counting module 110, and is configured to receive the calibration clock signal ($CLK_{cal}$). A second input end of the first OR gate 111 serves as the second input end of the first counting module 110 or is coupled to the second input end of the first counting module 110, and is configured to receive the counting clock signal ($CLK_{cnt}$). An output end of the first OR gate 111 is coupled to a first input end of the first AND gate 112. A second input end of the first AND gate 112 is configured to receive a first counting control signal (CNT_1), and an output end of the first AND gate 112 is coupled to an input end of the first counter 113. An output end of the first counter 113 serves as the output end of the first counting module 110 or is coupled to the output end of the first counting module 110. The first counting control signal (CNT_1) is at a high level within the preset counting period.

The second counting module 120 is provided with a first input end, a second input end, and an output end. The first input end of the second counting module 120 serves as the first input end of the counting unit or is coupled to the first input end of the counting unit, and is configured to receive the calibration clock signal ($CLK_{cal}$). The second input end of the second counting module 120 serves as the second input end of the counting unit or is coupled to the second input end of the counting unit, and is configured to receive the counting clock signal ($CLK_{cnt}$). The output end of the second counting module 120 serves as the second output end of the counting unit or is coupled to the second output end of the counting unit. The second counting module 120 is configured to acquire a second number of a counting pulse generated in the low-level state of the calibration clock signal within the preset counting period.

In the embodiment, the second counting module 120 includes a second AND gate 121, a second OR gate 122, and a second counter 123. A first input end of the second AND gate 121 serves as the first input end of the second counting module 120 or is coupled to the first input end of the second counting module 120, and is configured to receive the calibration clock signal ($CLK_{cal}$). A second input end of the second AND gate 121 serves as the second input end of the second counting module 120 or is coupled to the second input end of the second counting module 120, and is configured to receive the counting clock signal ($CLK_{cnt}$). An output end of the second AND gate 121 is coupled to a first input end of the second OR gate 122. A second input end of the second OR gate 122 is configured to receive a second counting control signal (CNT_2), and an output end of the second OR gate 122 is coupled to an input end of the second counter 123. An output end of the second counter 123 serves as the output end of the second counting module 120 or is coupled to the output end of the second counting module 120. The second counting control signal (CNT_2) is at a low level within the preset counting period.

With reference to FIG. 1 continuously, the control unit 20 is provided with a first input end, a second input end, and an output end. The first input end and the second input end of the control unit 20 are coupled to the counting unit 10, and the output end of the control unit 20 is coupled to the duty cycle adjustment unit 30. The control unit 20 is configured to receive the number of counting pulses generated in a high-level state and a low-level state of the calibration clock signal within a preset counting period; acquire information of a current duty cycle of the calibration clock signal according to the number of counting pulses generated in a high-level state and a low-level state of the calibration clock signal within a preset counting period; compare the current duty cycle of the calibration clock signal with a preset target duty cycle; and generate a corresponding control signal according to a comparison result between the current duty cycle of the calibration clock signal and the target duty cycle.

The duty cycle adjustment unit 30 is provided with a first input end, a second input end, and an output end. The first input end of the duty cycle adjustment unit 30 is coupled to the control unit 20. The second input end of the duty cycle adjustment unit 30 is configured to receive an input clock signal. The output end of the duty cycle adjustment unit 30 is coupled to the counting unit 10. The duty cycle adjustment unit 30 is configured to receive the control signal and the input clock signal; and adjust a duty cycle of the input clock signal according to the control signal received, and acquire the calibration clock signal until a duty cycle of the calibration clock signal reaches the target duty cycle.

Specifically, the control unit 20 includes a finite state machine. The finite state machine has a preset number of states, so as to switch between the preset number of states. Therefore, different control signals are output to the duty cycle adjustment unit 30, so that the duty cycle adjustment unit 30 may correspondingly adjust the duty cycle of the input clock signal according to the control signals.

In the embodiment, the finite state machine controls the duty cycle of the calibration clock signal through a voltage increase control signal and a voltage decrease control signal. Specifically, the finite state machine is configured to generate a corresponding voltage increase control signal in a case of determining that the current duty cycle of the calibration clock signal is lower than the target duty cycle; and generate a corresponding voltage decrease control signal in a case of determining that the duty cycle of the calibration clock signal is higher than the target duty cycle.

Correspondingly, the duty cycle adjustment unit 30 is configured to generate tune voltages in a plurality of gears; adjust the duty cycle of the input clock signal through a tune voltage in a next gear greater than a tune voltage in current gear in a case of receiving the voltage increase control signal; and adjust the duty cycle of the input clock signal through a tune voltage in a next gear lower than a tune voltage in a current gear in a case of receiving the voltage decrease control signal.

Figure 3:
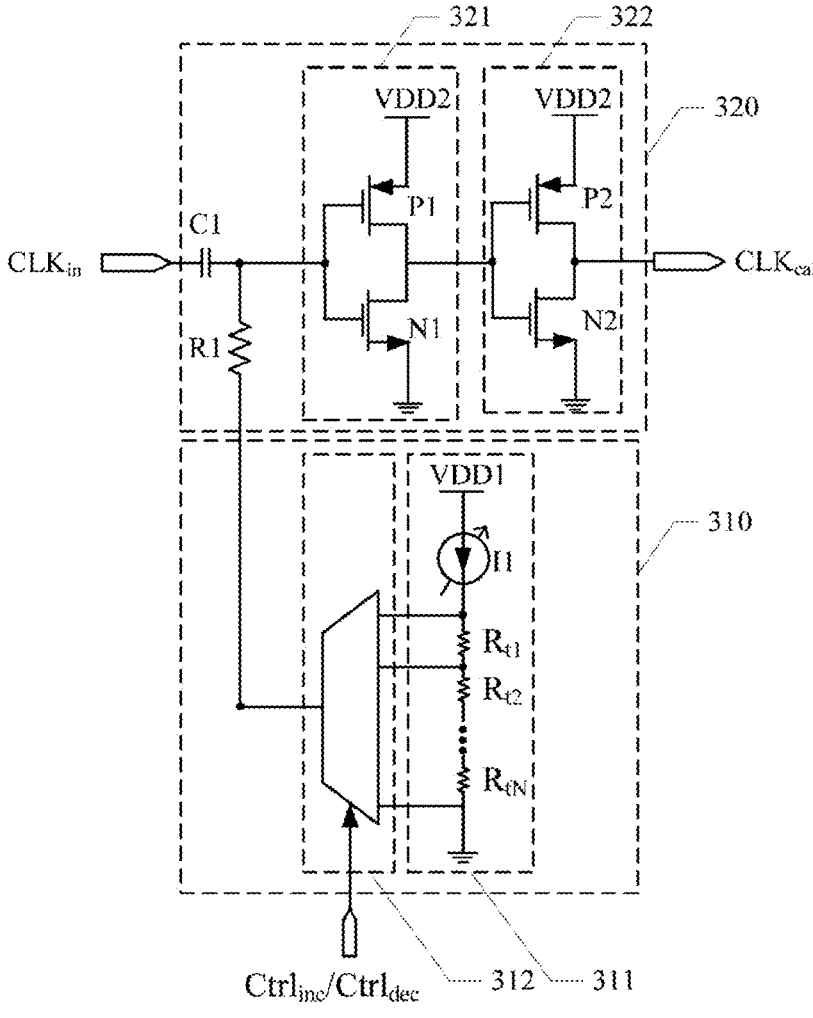
FIG. 3 is a schematic structural diagram of a duty cycle adjustment unit in an embodiment of the disclosure.

FIG. 3 is a schematic structural diagram of a duty cycle adjustment unit in an embodiment of the disclosure. With reference to FIG. 3, the duty cycle adjustment unit in the embodiment of the disclosure includes a tune voltage providing module 310 and a duty cycle shaping module 320. The tune voltage providing module 310 and the duty cycle shaping module 320 are coupled to each other.

The tune voltage providing module 310 is provided with an input end and an output end. The input end of the tune voltage providing module 310 serves as a first input end of the duty cycle adjustment unit or is coupled to a first input end of the duty cycle adjustment unit. The output end of the tune voltage providing module 310 is coupled to the duty cycle shaping module 320. The tune voltage providing module 310 is configured to perform voltage division processing on a first preset voltage drain drain through a plurality of voltage division resistors connected in series, so as to generate the tune voltages in a plurality of gears; select and output the tune in a next gear greater than the tune voltage in a current gear in a case of receiving the voltage increase control signal; and select and output the tune voltage in a next gear lower than the tune voltage in a current gear in a case of receiving the voltage decrease control signal.

Specifically, the tune voltage providing module 310 includes a tune voltage generation sub-module 311 and a selection and output sub-module 312. The tune voltage generation sub-module 311 and the selection and output sub-module 312 are coupled to each other.

The tune voltage generation sub-module 311 is provided with an input end and N output ends. The input end of the tune voltage generation sub-module 311 is configured to receive the first voltage drain drain (VDD1), and the N output ends of the tune voltage generation sub-module 311 are coupled to the selection and output sub-module 312. The tune voltage generation sub-module 311 may perform voltage division processing on the first preset voltage drain drain through the plurality of voltage division resistors connected in series, so as to generate and output the tune voltages in a plurality of gears.

Specifically, the tune voltage generation sub-module 311 includes a current source (I1) and N voltage division resistors ($R_{r1}$-$R_{rN}$) (N is an integer greater than 1) connected in series. A first end of the current source (I1) is configured to receive the first voltage drain drain (VDD1), and a second end of the current source (I1) is grounded through the N voltage division resistors ($R_{r1}$-$R_{rN}$) connected in series.

It should be noted that the N output ends of the tune voltage generation sub-module 311 are arranged corresponding one-to-one to the N voltage division resistors ($R_{r1}$-$R_{rN}$). Specifically, first ends of the N voltage division resistors ($R_{r1}$-$R_{rN}$) serve as the N output ends of the tune voltage generation sub-module 311 or are coupled to the N output ends of the tune voltage generation sub-module 311 respectively. Specifically, a first end of the voltage division resistor ($R_{r1}$) serves as a first output end of the tune voltage generation sub-module 311 or is coupled to a first output end of the tune voltage generation sub-module 311. A first end of the voltage division resistor ($R_{r2}$) serves as a second output end of the tune voltage generation sub-module 311 or is coupled to a second output end of the tune voltage generation sub-module 311, . . . , and a first end of the voltage division resistor ($R_{rN}$) serves as an Nth output end of the tune voltage generation sub-module 311 or is coupled to an Nth output end of the tune voltage generation sub-module 311.

Correspondingly, the selection and output sub-module 312 is provided with N input ends, a control end, and an output end. The N input ends of the selection and output sub-module 312 are configured to receive tune voltages in N gears output by the tune voltage generation sub-module 311 respectively. The control end of the selection and output sub-module 312 serves as the input end of the tune voltage providing module 310 or is coupled to the input end of the tune voltage providing module 310. The output end of the selection and output sub-module 312 serves as the output end of the tune voltage providing module 310 or is coupled to the output end of the tune voltage providing module 310. The selection and output sub-module 312 is configured to select and output the tune voltage in a next gear greater than the tune voltage in a current gear in a case of receiving the voltage increase control signal ($Ctrl_{inc}$); and select and output the tune voltage in a next gear lower than the tune voltage in a current gear in a case of receiving the voltage decrease control signal ($Ctrl_{dec}$).

In the embodiment, the selection and output sub-module 312 includes a multiplexer (MUX). The multiplexer is provided with N input ends and an output end, which serve as the N input ends and the output end of the selection and output sub-module 312 respectively. In other embodiments, the selection and output sub-module may also be implemented through other functions having the same structure, which will not be limited herein.

The duty cycle shaping module 320 is provided with a first input end, a second input end, and an output end. The first input end of the duty cycle shaping module 320 serves as the second input end of the duty cycle adjustment unit or is coupled to the second input end of the duty cycle adjustment unit. The second input end of the duty cycle shaping module 320 is coupled to the output end of the tune voltage providing module 310. The output end of the duty cycle shaping module 320 serves as the output end of the duty cycle adjustment unit or is coupled to the output end of the duty cycle adjustment unit. The duty cycle shaping module 320 is configured to receive a tune voltage in a corresponding gear; and adjust the duty cycle of the input clock signal through the received tune voltage in a corresponding gear, and acquire the calibration clock signal.

With reference to FIG. 3 continuously, in the embodiment, the duty cycle shaping module 320 includes a first inverter 321 and a second inverter 322. The first inverter 321 and the second inverter 322 are coupled to each other.

The first inverter 321 includes a first P-channel metal oxide semiconductor (PMOS) transistor (P1) and a first N-channel metal oxide semiconductor (NMOS) transistor (N1). A gate end of the first PMOS transistor (P1) is coupled to a gate end of the first NMOS transistor (N1), and serves as the first input end of the duty cycle shaping module 320 or is coupled to the first input end of the duty cycle shaping module 320. A source end of the first PMOS transistor (P1) is configured to receive a second voltage drain drain (VDD2). A drain end of the first PMOS transistor (P1) is coupled to a drain end of the first NMOS transistor (N1), and serves as an output end of the first inverter 321 or is coupled to an output end of the first inverter 321. A source end of the first NMOS transistor (N1) is grounded. The first inverter 321 is configured to adjust a ratio of a connection time of the first PMOS transistor (P1) to a connection time of the first NMOS transistor (N1) through the tune voltage in a corresponding gear, so as to adjust the duty cycle of the input clock signal ($CLK_{in}$), and perform inversion processing on the input clock signal ($CLK_{in}$), so as to obtain an inverted clock signal.

The second inverter 322 includes a second PMOS transistor (P2) and a second NMOS transistor (N2). A gate end of the second PMOS transistor (P2) is coupled to a gate end of the second NMOS transistor (N2), and serves as an input end of the second inverter 322 or is coupled to an input end of the second inverter 322. A source end of the second PMOS transistor (P2) is configured to receive the second voltage drain drain (VDD2). A drain end of the second PMOS transistor (P2) is coupled to a drain end of the second NMOS transistor (N2), and serves as the output end of the duty cycle shaping module or is coupled to the output end of the duty cycle shaping module. A source end of the second NMOS transistor (N2) is grounded. The second inverter 322 is configured to perform buffering and inversion processing on the inverted clock signal output by the first inverter 321, so as to generate the calibration clock signal ($CLK_{cal}$).

In the embodiment, the duty cycle shaping module 320 further includes a bias voltage generation sub-module (not indicated).

The bias voltage generation sub-module is provided with an input end and an output end. The input end of the bias voltage generation sub-module serves as the first input end of the duty cycle shaping module 320 or is coupled to the first input end of the duty cycle shaping module 320. The output end of the bias voltage generation sub-module is coupled to the input end of the first inverter 321. The bias voltage generation sub-module is configured to receive the tune voltage in a corresponding gear, and perform bias processing on the tune voltage in a corresponding gear, so as to obtain a corresponding bias voltage.

In the embodiment, the bias voltage generation sub-module includes a first resistor (R1). A first end of the first resistor (R1) serves as the input end of the bias voltage generation sub-module or is coupled to the input end of the bias voltage generation sub-module. A second end of the first resistor (R1) serves as the output end of the bias voltage generation sub-module or is coupled to the output end of the bias voltage generation sub-module.

In the embodiment, the duty cycle shaping module 320 further includes an alternating current coupling sub-module (not indicated).

The alternating current coupling sub-module is provided with an input end and an output end. The input end of the alternating current coupling sub-module serves as the second input end of the duty cycle shaping module 320 or is coupled to the second input end of the duty cycle shaping module 320. The output end of the alternating current coupling sub-module is coupled to the input end of the first inverter 321. The alternating current coupling sub-module is configured to perform direct current signal elimination processing on the input clock signal ($CLK_{in}$).

In the embodiment, the alternating current coupling sub-module includes a first capacitor (C1). A first end of a first capacitor (C1) serves as the input end of the alternating current coupling sub-module or is coupled to the input end of the alternating current coupling sub-module, and is configured to receive the input clock signal (CLK$_{in}$). A second end of the first capacitor (C1) serves as the output end of the alternating current coupling sub-module or is coupled to the output end of the alternating current coupling sub-module, and is coupled to the input end of the first inverter 321.

In other embodiments, the duty cycle shaping module may also be implemented through other structures having the same function.

Figure 4:
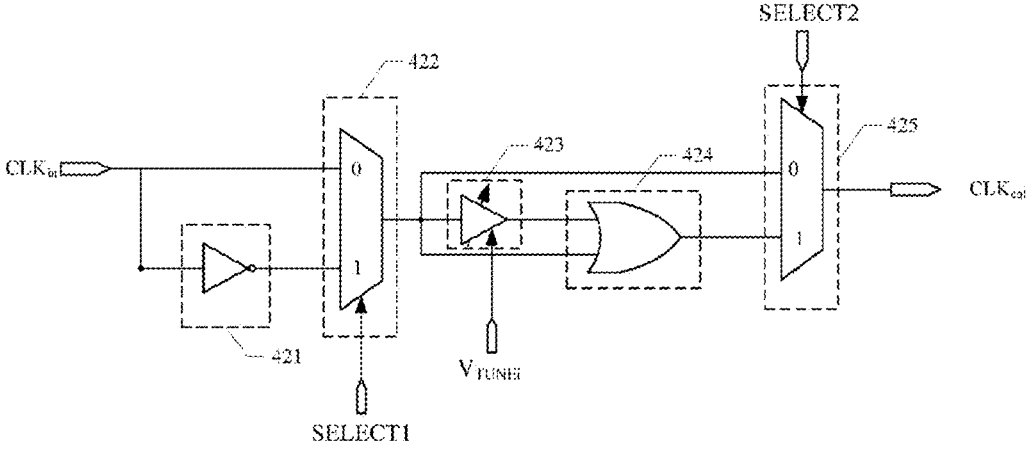
FIG. 4 is a schematic structural diagram of a duty cycle shaping module in an embodiment of the disclosure.
Figure 5:
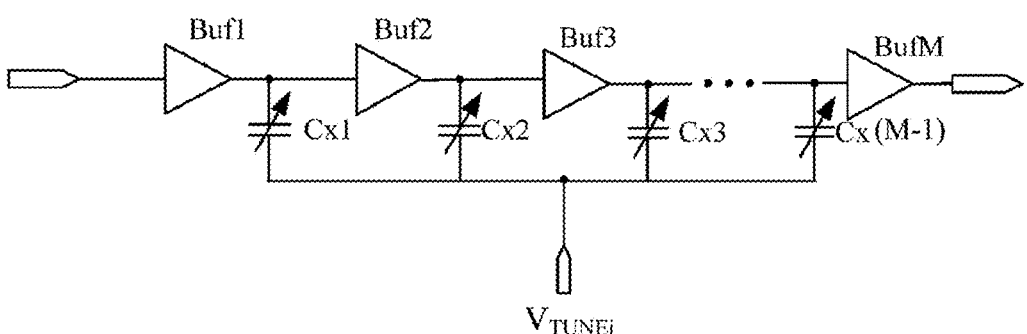
FIG. 5 is a schematic structural diagram of a delay sub-module in an embodiment of the disclosure.

FIG. 4 is a schematic structural diagram of another duty cycle shaping module in an embodiment of the disclosure. FIG. 5 is a schematic structural diagram of an embodiment of a delay sub-module of the duty cycle shaping module in FIG. 4. With reference to FIGS. 4 and 5, the duty cycle shaping module includes a third inverter 421, a first selection sub-module 422, a delay sub-module 423, a third OR gate 424, and a second selection sub-module 425.

The third inverter 421 is provided with an input end and an output end. The input end of the third inverter 421 serves as the second input end of the duty cycle shaping module or is coupled to the second input end of the duty cycle shaping module, and is configured to receive the input clock signal (CLK$_{in}$). The output end of the third inverter 421 is coupled to the first input end of the first selection sub-module 422. The third inverter 421 is configured to receive the input clock signal (CLK$_{in}$), and perform inversion processing on the input clock signal (CLK$_{in}$), so as to obtain an inverted input clock signal.

The first selection sub-module 422 is provided with a first input end, a second input end, a selection control end, and an output end. The first input end of the first selection sub-module 422 serves as the first input end of the duty cycle shaping module or is coupled to the first input end of the duty cycle shaping module, and is configured to receive the input clock signal (CLK$_{in}$). The second input end of the first selection sub-module 422 is coupled to the output end of the third inverter 421. The selection control end of the first selection sub-module 422 is configured to receive a first selection control signal (SELECT1). The output end of the first selection sub-module 422 is coupled to the delay sub-module 423, the third OR gate 424, and the second selection sub-module 425. The first selection sub-module 422 is configured to receive the first selection control signal (SELECT1), and select the input clock signal (CLK$_{in}$) or the inverted input clock signal as a selection clock signal according to the first selection control signal (SELECT1). In a case that the duty cycle of the calibration clock signal is greater than the target duty cycle, the first selection control signal (SELECT1) is logic 1; and in a case that the duty cycle of the calibration clock signal is lower than the target duty cycle, the first selection control signal (SELECT1) is logic 0.

As an example, the first selection sub-module 422 is a multiplexer. In other embodiments, the first selection sub-module 422 may also be of another structure having the same function, which will not be limited herein.

The delay sub-module 423 is provided with an input end, a control end, and an output end. The input end of the delay sub-module 423 is coupled to the first selection sub-module 422. The control end of the delay sub-module 423 serves as the first input end of the duty cycle shaping module or is coupled to the first input end of the duty cycle shaping module. The output end of the delay sub-module 423 is coupled to the first input end of the third OR gate 424. The delay sub-module 423 may receive the selection clock signal, and perform delay processing on the selection clock signal through the tune voltage in a corresponding gear, so as to obtain a delay clock signal.

As an example, the delay sub-module 423 includes (M−1) voltage-controlled capacitors (Cx1-CxM) and M buffers (Buf1-BufM) (M is an integer greater than 1) connected in series. A first end of each voltage-controlled capacitor (Cxi) (i is an integer greater than or equal to 1 and less than or equal to M) is configured to receive the tune voltage (V$_{TUNEi}$) in a corresponding gear. A second end of each voltage-controlled capacitor (Cxi) is coupled to an output end of a corresponding buffer (Bufi).

The third OR gate 424 is provided with a first input end, a second input end, and an output end. The first input end of the third OR gate 424 is coupled to the delay sub-module 423. The second input end of the third OR gate 424 is coupled to the first selection sub-module 422. The output end of the third OR gate 424 is coupled to the second selection sub-module 425. The third OR gate 424 is configured to receive the selection clock signal and the delay clock signal, and acquire an initial calibration clock signal according to the selection clock signal and the delay clock signal.

The second selection sub-module 425 is provided with a first input end, a second input end, and an output end. The first input end of the second selection sub-module 425 is coupled to the first selection sub-module 422. The second input end of the second selection sub-module 425 is coupled to the output end of the third OR gate 424. The output end of the second selection sub-module 425 serves as the output end of the duty cycle shaping module or is coupled to the output end of the duty cycle shaping module. The second selection sub-module 425 is configured to receive a second selection control signal (SELECT2), and select the selection clock signal and the initial calibration clock signal as the calibration clock signals (CLK$_{cal}$) according to the second selection control signal (SELECT2).

As an example, the second selection sub-module 425 is a multiplexer. In other embodiments, the second selection sub-module 425 may also be of another structure having the same function, which will not be limited herein.

The structure of the duty cycle calibration circuit in the embodiment of the disclosure is described above, and an operating principle of the above duty cycle calibration circuit will be described below.

Figure 6:
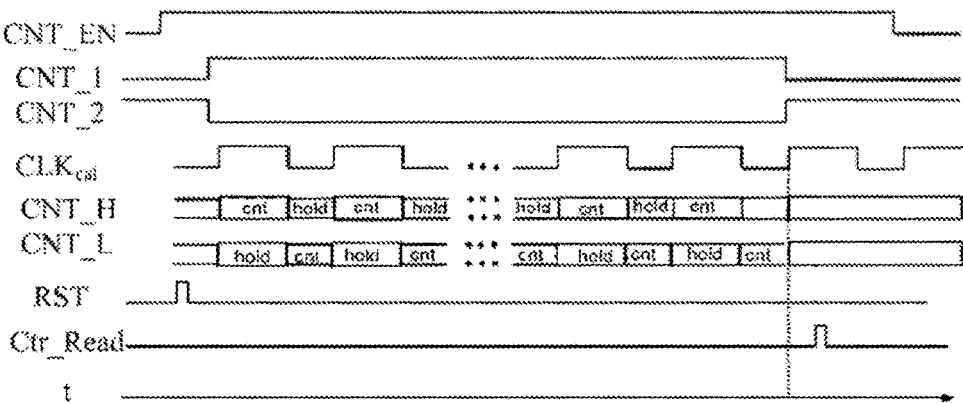
FIG. 6 is a pulse timing diagram of a relevant signal of a circuit for calibrating a duty cycle in an embodiment of the disclosure.

FIG. 6 is a pulse timing diagram of a relevant signal of a duty cycle calibration circuit in an embodiment of the disclosure. FIG. 7 is a schematic flowchart of a duty cycle calibration method in an embodiment of the disclosure. With reference to FIGS. 1-7, the duty cycle calibration method in the embodiment of the disclosure may specifically include:

S701: a number of counting pulses generated in a high-level state and a low-level state of a calibration clock signal within a preset counting period is acquired; where a frequency of a counting clock signal generating the counting pulses is higher than that of the calibration clock signal.

The number of counting pulses generated in a high-level state and a low-level state of a calibration clock signal within a preset counting period is acquired, so as to obtain a current duty cycle of the calibration clock signal subsequently.

The counting clock signal (CLK$_{cnt}$) is configured to detect the high-level state and the low-level state of the calibration clock signal (CLK$_{cal}$) within the preset counting period. Specifically, a first number of a counting pulse generated in the high-level state of the calibration clock signal (CLK$_{cal}$) within the preset counting period, and a second number of a counting pulse generated in the low-level state of the calibration clock signal (CLK$_{cal}$) within the preset counting period are acquired.

Therefore, the frequency of the counting clock signal $(CLK_{cnt})$ is required to be higher than that of the calibration clock signal $(CLK_{cal})$. Therefore, the number of counting pulses generated in a high-level state and a low-level state of a calibration clock signal $(CLK_{cal})$ within a preset counting period is acquired through the counting clock signal $(CLK_{cnt})$.

The counting clock signal $(CLK_{cnt})$ may be generated through any appropriate clock signal generation source. As an example, the counting clock signal $(CLK_{cnt})$ is generated through a ring voltage-controlled oscillator (VCO).

It can be understood that in a case that the calibration clock signal $(CLK_{cal})$ has a fixed frequency, the higher the frequency of the counting clock signal $(CLK_{cnt})$ is, the greater the first number of a counting pulse generated in the high-level state of the calibration clock signal $(CLK_{cal})$ within the preset counting period, and the second number of a counting pulse generated in the low-level state of the calibration clock signal within the preset counting period are, and more precise the fine differences between the first number and the second number acquired and reflected by the first number and the second number are. Therefore, precision of the duty cycle of the calibration clock signal $(CLK_{cal})$ obtained subsequently can be improved, and precision of calibration of the duty cycle can be improved accordingly.

The preset counting period may be set as demanded in practice. Specifically, the preset counting period is relevant to the frequencies of the counting clock signal $(CLK_{cnt})$ and the calibration clock signal $(CLK_{cal})$ and precision of counting.

For example, in a case that a ratio of the frequency of the counting clock signal to the frequency of the calibration clock signal is 100:1, the precision of counting of only 1% can be reached within one calibration clock period. Therefore, precision of counting of 1% % is implemented based on 10 calibration clock periods accordingly.

Therefore, the preset counting period is directly proportional to the ratio of the frequency of the counting clock signal $(CLK_{cnt})$ to the frequency of the calibration clock signal $(CLK_{cal})$, and inversely proportional to the precision of counting.

In the embodiment, the number of counting pulses generated in a high-level state and a low-level state of a calibration clock signal $(CLK_{cal})$ within a preset counting period is acquired through the counting unit 10. Specifically, the first number of a counting pulse generated in the high-level state of the calibration clock signal $(CLK_{cal})$ within the preset counting period is acquired through the first counting module 110. The second number of a counting pulse generated in the low-level state of the calibration clock signal $(CLK_{cal})$ within the preset counting period is acquired through the second counting module 120.

Before counting is executed through the counting unit 10, a corresponding initialization operation is executed first, so that the counting unit 10 is in a ready state. Specifically, a counting enabling signal (CNT_EN), a first counting control signal (CNT_1), a second counting control signal (CNT_2), and a counting reset signal (RST) are set.

Specifically, the counting enabling signal (CNT_EN) and the first counting control signal (CNT_1) are at a high level within the counting clock period, and the second counting control signal (CNT_2) is at a high level within the counting clock period. Before the counting clock period starts, counted values of the first counting module and the second counting module are cleared through the counting reset signal (RST).

After counting starts, in the first counting module 110, in a case that the calibration clock signal $(CLK_{cal})$ is in the high-level state, an output signal at the output end of the first OR gate 111 is decided by the counting clock signal $(CLK_{cnt})$. In other words, the output signal at the output end of the first OR gate 111 is identical to the counting clock signal $(CLK_{cnt})$. Moreover, the second output end of the first AND gate 112 is configured to receive the first counting control signal (CNT_1), and the first counting control signal (CNT_1) is at the high level within the counting period. Therefore, the output signal at the output end of the second AND gate 112 is decided by the counting clock signal $(CLK_{cnt})$ at the first input end of the second AND gate, so that the output signal at the output end of the second AND gate 112 is identical to the counting clock signal $(CLK_{cnt})$. Then, the first counter 113 may count the counting pulse generated in the high-level state of the calibration clock signal $(CLK_{cal})$ within the preset counting period.

Similarly, in the second counting module 120, in a case that the calibration clock signal $(CLK_{cal})$ is in the low-level state, an output signal at the output end of the second AND gate 121 is decided by the counting clock signal $(CLK_{cnt})$. In other words, the output signal at the output end of the second AND gate 121 is identical to the counting clock signal $(CLK_{cnt})$. Moreover, the second output end of the second OR gate 122 is configured to receive the second counting control signal (CNT_2), and the second counting control signal (CNT_2) is at the low level within the counting period. Therefore, the output signal at the output end of the second OR gate 122 is decided by the counting clock signal $(CLK_{cnt})$ at the first input end of the first OR date, so that the output signal at the output end of the second OR gate 122 is identical to the counting clock signal $(CLK_{cnt})$. Then, the second counter 123 may count the counting pulse generated in the low-level state of the calibration clock signal $(CLK_{cal})$ within the preset counting period.

S702: information of a current duty cycle of the calibration clock signal is acquired according to the number of counting pulses generated in a high-level state and a low-level state of a calibration clock signal within a preset counting period.

The information of a current duty cycle of the calibration clock signal $(CLK_{cal})$ is acquired and compared with a target duty cycle of the calibration clock signal $(CLK_{cal})$, so that the target duty cycle of the calibration clock signal $(CLK_{cal})$ may be adjusted according to a comparison result.

Specifically, the step that information of a current duty cycle of the calibration clock signal $(CLK_{cal})$ is acquired according to the number of counting pulses generated in a high-level state and a low-level state of a calibration clock signal $(CLK_{cal})$ within a preset counting period includes: the information of a current duty cycle of the calibration clock signal $(CLK_{cal})$ is acquired by calculating a ratio of the first number of a counting pulse generated in the high-level state of the calibration clock signal $(CLK_{cal})$ within the preset counting period to the sum of the first number of a counting pulse generated in the high-level state of the calibration clock signal $(CLK_{cal})$ within the preset counting period and the second number of a counting pulse generated in the low-level state of the calibration clock signal within the preset counting period.

For example, in a case that the numbers of counting clock signals generated in the high-level state and the low-level state of the calibration clock signal within the preset counting period are 2500 and 7500 respectively, the current duty cycle of the calibration clock signal is 2500/(2500+7500), i.e. 25%.

In the embodiment, the information of a current duty cycle of the calibration clock signal (CLK$_{cal}$) is acquired through the control unit 20 according to the number of counting pulses generated in a high-level state and a low-level state of a calibration clock signal (CLK$_{cal}$) within a preset counting period.

Specifically, when determining that the preset counting period ends, the control unit 20 generates a corresponding reading control signal (Ctr_Read), and transmits same to the counting unit 10. Therefore, the first counting module 110 and the second counting module 120 of the counting unit 10 latch the first number of a counting pulse generated in the high-level state of the calibration clock signal (CLK$_{cal}$) within the preset counting period and the second number of a counting pulse generated in the low-level state of the calibration clock signal within the preset counting period respectively. Then, the control unit 20 acquires the first number of a counting pulse generated in the high-level state of the calibration clock signal (CLK$_{cal}$) within the preset counting period and the second number of a counting pulse generated in the low-level state of the calibration clock signal within the preset counting period from the first counting module 110 and the second counting module 120 of the counting unit 10 respectively, and acquires the information of a current duty cycle of the calibration clock signal (CLK$_{cal}$) through calculation according to the first number and the second number acquired from the first counting module 110 and the second counting module 120 of the counting unit 10 respectively.

It can be seen that by acquiring the information of a current duty cycle of the calibration clock signal (CLK$_{cal}$) according to the first number of a counting pulse generated in the high-level state of the calibration clock signal (CLK$_{cal}$) within the preset counting period and the second number of a counting pulse generated in the low-level state of the calibration clock signal within the preset counting period, instead of acquiring the information of a current duty cycle of the calibration clock signal by comparing the calibration clock signal with a reference clock signal, inaccuracy of the current duty cycle acquired of the calibration clock signal caused by the incorrect reference clock signal can be avoided. Therefore, accuracy of measurement of the duty cycle can be improved, and precision of calibration of the duty cycle can be improved accordingly.

S703: the duty cycle of the calibration clock signal is compared with a preset target duty cycle, and a corresponding control signal is generated according to a comparison result between the duty cycle of the calibration clock signal and the preset target duty cycle.

The corresponding comparison result is acquired by comparing the duty cycle of the calibration clock signal (CLK$_{cal}$) with the preset target duty cycle, and the corresponding control signal is generated according to the comparison result, so as to control the duty cycle of the calibration clock signal (CLK$_{cal}$).

In the embodiment, the control unit 20 is configured to compare the duty cycle of the calibration clock signal (CLK$_{cal}$) with the preset target duty cycle, and generate the corresponding control signal according to the comparison result between the duty cycle of the calibration clock signal (CLK$_{cal}$) and the preset target duty cycle.

Subsequently, the duty cycle of the input clock signal is adjusted by adjusting the tune voltage (V$_{TUNE}$). Correspondingly, the control unit 20 adjusts the tune voltage (V$_{TUNE}$) through the voltage increase control signal (Ctrl$_{inc}$) and the voltage decrease control signal (Ctrl$_{dec}$).

Specifically, the control unit 20 generates the voltage decrease control signal (Ctrl$_{dec}$), so as to decrementally adjust the tune voltage (V$_{TUNE}$) when determining that the current duty cycle of the calibration clock signal (CLK$_{cal}$) is greater than the target duty cycle, and generates the voltage increase control signal (Ctrl$_{inc}$), so as to incrementally adjust the tune voltage (V$_{TUNE}$) when determining that the current duty cycle of the calibration clock signal (CLK$_{cal}$) is lower than the target duty cycle.

S704: the duty cycle of the input clock signal is adjusted according to the control signal until the duty cycle generated of the calibration clock signal reaches the target duty cycle.

The duty cycle of the input clock signal (CLK$_{in}$) is adjusted according to the control signal received until the duty cycle of the calibration clock signal (CLK$_{cal}$) finally reaches the target duty cycle.

In the embodiment, the duty cycle adjustment unit 30 is configured to adjust the duty cycle of the input clock signal (CLK$_{in}$) according to on the control signal received.

Specifically, the tune voltage providing module 310 of the duty cycle adjustment unit 30 is configured to perform voltage division processing on a first preset voltage drain drain (VDD1) through a plurality of voltage division resistors (R$_{t1}$-R$_{tN}$) connected in series, so as to generate the tune voltages (V$_{TUNE1}$-V$_{TUNE}$) in a plurality of gears; select and output a tune voltage in a next gear greater than a tune voltage in a current gear in a case of receiving the voltage increase control signal (Ctrl$_{inc}$); and select and output a tune voltage in a next gear lower than a tune voltage in a current gear in a case of receiving the voltage decrease control signal (Ctrl$_{dec}$).

In the embodiment, the tune voltage providing module 310 of the duty cycle adjustment unit 30 generates the tune voltages in a plurality of gears through the tune voltage generation sub-module 311. The tune voltages in N gears generated through the tune voltage generation sub-module 311 may be calculated based on the formula as follows:

$$V_{TUNEi} = VDD - I_{TUNE} * (R_{t1} + R_{t2} + ... + R_{t(i-1)}) \qquad (1)$$

V$_{TUNEi}$ indicates a tune voltage in an ith gear, I$_{TUNE}$ indicates a constant current output by a current source, and R$_{t\,(i-1)}$ indicates an (i–1)th voltage division resistor, and i is an integer greater than or equal to 1 and less than or equal to N.

The selection and output sub-module 312 of the tune voltage providing module 310$_{inc}$ selects and outputs the tune voltage in a next gear greater than the tune voltage in a current gear after receiving the voltage increase control signal (Ctrl$_{inc}$), and selects and outputs the tune voltage in a next gear lower than the tune voltage in a current gear after receiving the voltage decrease control signal (Ctrl$_{dec}$).

It can be seen from formula (1) that the tune voltage (V$_{TUNEi}$) is inversely proportional to the gear i in which it is located. In other words, the tune voltage in a high gear is lower than the tune voltage in a low gear. Therefore, in a case that a tune voltage (V$_{TUNEi}$) in an ith gear is the tune voltage in a current gear, V$_{TUNE\,(i-1)}$ indicates the tune voltage in a next gear greater than the tune voltage in a current gear, and V$_{TUNE\,(i+1)}$ indicates the tune voltage in a next gear lower than the tune voltage in a current gear.

The duty cycle shaping module 320 of the duty cycle adjustment unit 30 receives the tune voltage (V$_{TUNEi}$) in a corresponding gear, and adjusts the duty cycle of the input clock signal ($CLK_{in}$) through the received tune voltage ($V_{TUNEi}$) in a corresponding gear.

With reference to FIG. 3, in the embodiment, in a case that the duty cycle of the input clock signal ($CLK_{in}$) is adjusted through the received tune voltage ($V_{TUNEi}$) in a corresponding gear, the first capacitor C1 performs direct current elimination processing on the input clock signal ($CLK_{in}$), and then outputs a processed input clock signal into the input end of the first inverter 311. Therefore, interference in adjustment of the duty cycle caused by a direct-current signal in the input clock signal ($CLK_{in}$) is eliminated.

Moreover, bias processing is performed on the tune voltage ($V_{TUNEi}$) in a corresponding gear provided by the tune voltage providing module 310 through the first resistor R1, so as to generate a corresponding bias voltage. Then the corresponding bias voltage is provided for the input end of the first inverter 311, so as to provide the bias voltage for the duty cycle shaping module. Therefore, a ratio of a connection time of the first PMOS transistor (P1) to a connection time of the first NMOS transistor (N1) of the first inverter 311 is adjusted through the tune voltage in a corresponding gear. In other words, the ratio of a connection time of the first PMOS transistor (P1) to a connection time of the first NMOS transistor (N1) of the first inverter 311 is adjusted through the bias voltage. Accordingly, first inversion processing is performed on the input clock signal ($CLK_{in}$), so as to generate a corresponding inverted clock signal, and a duty cycle of the inverted clock signal is adjusted.

Specifically, the greater the bias voltage is, the shorter the connection time of the first PMOS transistor (P1) is, and the longer the connection time of the first NMOS transistor (N1) is, so that the duty cycle of the inverted clock signal is decreased. On the contrary, the lower the bias voltage is, the longer the connection time of the first PMOS transistor (P1) is, and the shorter the connection time of the first NMOS transistor (N1) is, so that the duty cycle of the inverted clock signal is increased.

Next, the second inverter 322 is configured to perform buffering and inversion processing on a first inverted clock signal, so that a calibration clock signal $CLK_{cal}$ generated maintains the same phase with the input clock signal ($CLK_{in}$). Moreover, the calibration clock signal ($CLK_{cal}$) is inverted with respect to a first inverted clock signal. Therefore, in a case that a duty cycle of the first inverted clock signal is increased, the duty cycle of the calibration clock signal ($CLK_{cal}$) is decreased accordingly; and in a case that a duty cycle of the first inverted clock signal is decreased, the duty cycle of the calibration clock signal ($CLK_{cal}$) is increased accordingly.

Therefore, in a case that the current duty cycle of the calibration clock signal ($CLK_{cal}$) is greater than the target duty cycle, the duty cycle of the calibration clock signal ($CLK_{cal}$) is decreased by decreasing the tune voltage ($V_{TUNE}$) input into the duty cycle shaping module; and in a case that the current duty cycle of the calibration clock signal ($CLK_{cal}$) is lower than the target duty cycle, the duty cycle of the calibration clock signal ($CLK_{cal}$) is increased by increasing the tune voltage ($V_{TUNE}$) input into the duty cycle shaping module. Such repetition is performed until the duty cycle generated of the calibration clock signal ($CLK_{cal}$) reaches the target duty cycle.

In other embodiments, the duty cycle shaping module 320 may further select an input clock signal or an inverted input clock signal having a duty cycle lower than the target duty cycle, and perform duty cycle increase processing on the input clock signal or the inverted input clock signal having a duty cycle lower than the target duty cycle. Therefore, the duty cycle acquired of the calibration clock signal reaches the target duty cycle. Reference may be made to FIGS. 4 and 5 for details.

As shown in FIGS. 4 and 5, initially, the first selection control signal (SELECT1) and the second selection control signal (SELECT2) are logic 0. In this case, the input clock signal ($CLK_{in}$) is output as the calibration clock signal ($CLK_{cal}$). In a case that the current duty cycle of the calibration clock signal ($CLK_{cal}$) is greater than the target duty cycle, it indicates that the duty cycle of the input clock signal ($CLK_{in}$) is greater than the target duty cycle, and the first selection control signal (SELECT1) is switched from logic 0 to logic 1. Accordingly, the first selection sub-module 422 outputs the inverted input clock signal having a duty cycle lower than the target duty cycle as the selection clock signal. On the contrary, in a case that the current duty cycle of the calibration clock signal ($CLK_{cal}$) is lower than the target duty cycle, it indicates that the duty cycle of the input clock signal ($CLK_{in}$) is lower than the target duty cycle, and a value of the first selection control signal (SELECT1) remains unchanged as logic 0. Accordingly, the first selection sub-module 422 outputs the input clock signal ($CLK_{in}$) having a duty cycle lower than the target duty cycle as the selection clock signal.

After the value of the first selection control signal (SELECT1) is set, a value of the second selection control signal (SELECT2) is switched from logic 0 to logic 1. Accordingly, the second selection sub-module 425 outputs the initial calibration clock signal output by the third OR gate 424 as the calibration clock signal.

The initial calibration clock signal output by the third OR gate 424 is generated according to the selection clock signal and the delay clock signal. Specifically, after the third OR gate 424 performs logic OR processing on the selection clock signal and the delay clock signal, a rising edge of the initial calibration clock signal output by the third OR gate 424 is decided by a rising edge of the selection clock signal, and a falling edge of the initial calibration clock signal is decided by a falling edge of the delay clock signal acquired after the selection clock signal is delayed.

Therefore, in a case that the duty cycle of the calibration clock signal ($CLK_{cal}$) is lower than the target duty cycle, a delay time of the delay sub-module 423 is prolonged by increasing the tune voltage ($V_{TUNE}$) in a corresponding gear. Therefore, the falling edge of the delay clock signal arrives later, and the duty cycle of the calibration clock signal is increased accordingly. In a case that the duty cycle of the calibration clock signal is greater than the target duty cycle, a delay time of the delay sub-module 423 is shortened by decreasing the tune voltage ($V_{TUNEi}$) in a corresponding gear. Therefore, the falling edge of the delay clock signal arrives earlier, and the duty cycle of the calibration clock signal is decreased accordingly. Such repetition is performed until the duty cycle generated of the calibration clock signal ($CLK_{cal}$) reaches the target duty cycle.

Correspondingly, a chip is further provided in an embodiment of the disclosure. The chip includes the duty cycle calibration circuit. Reference may be made to the above descriptions for the duty cycle calibration circuit, which will not be repeated herein.

Correspondingly, an electronic device is further provided in an embodiment of the disclosure. The electronic device includes the chip, where the chip includes the duty cycle calibration circuit. Reference may be made to the above descriptions for the duty cycle calibration circuit, which will not be repeated herein.

Various embodiment solutions according to the embodiments of the disclosure are described above. All optional methods described in each embodiment solution can be mutually combined and cross-referenced without conflict, so as to extend various possible embodiment solutions. These embodiment solutions can be deemed as being disclosed in the embodiments of the disclosure.

Although the embodiments of the disclosure are disclosed above, the disclosure is not limited thereto. Those skilled in the art can make various alterations and modifications without departing from the spirit and scope of the disclosure. Therefore, the scope of protection of the disclosure should be subject to the scope defined in the claims.

What is claimed is:

1. A duty cycle calibration circuit, comprising:
a counting unit configured to receive a calibration clock signal; and acquire a number of counting pulses generated in a high-level state and a low-level state of the calibration clock signal within a preset counting period; wherein a frequency of a counting clock signal generating the counting pulses is higher than that of the calibration clock signal;
a control unit configured to receive the number of counting pulses generated in the high-level state and the low-level state of the calibration clock signal within the preset counting period; acquire information of a current duty cycle of the calibration clock signal according to the number of counting pulses generated in the high-level state and the low-level state of the calibration clock signal within the preset counting period; compare the current duty cycle of the calibration clock signal with a preset target duty cycle; and generate a corresponding control signal according to a comparison result between the current duty cycle of the calibration clock signal and the preset target duty cycle; and
a duty cycle adjustment unit configured to receive the corresponding control signal and an input clock signal; and adjust a duty cycle of the input clock signal according to the corresponding control signal, and acquire a corresponding calibration clock signal until a duty cycle of the calibration clock signal reaches the preset target duty cycle,
wherein the control unit is configured to generate a corresponding voltage decrease control signal in a case of determining that the duty cycle of the calibration clock signal is greater than the preset target duty cycle; and generate a corresponding voltage increase control signal in a case of determining that the duty cycle of the calibration clock signal is lower than the preset target duty cycle,
wherein the duty cycle adjustment unit is configured to generate tune voltages in a plurality of gears; adjust the duty cycle of the input clock signal through a tune voltage in a next gear greater than a tune voltage in a current gear in a case of receiving the corresponding voltage increase control signal; and adjust the duty cycle of the input clock signal through a tune voltage in a next gear lower than a tune voltage in a current gear in a case of receiving the corresponding voltage decrease control signal.

2. The duty cycle calibration circuit according to claim 1, wherein the counting unit comprises:
a first counting module configured to acquire a first number of a counting pulse generated in the high-level state of the calibration clock signal within the preset counting period; and a second counting module configured to acquire a second number of a counting pulse generated in the low-level state of the calibration clock signal within the preset counting period.

3. The duty cycle calibration circuit according to claim 2, wherein the first counting module comprises a first OR gate, a first AND gate, and a first counter;
a first input end of the first OR gate is configured to receive the calibration clock signal, a second input end of the first OR gate is configured to receive the counting clock signal, and an output end of the first OR gate is coupled to a first input end of the first AND gate;
a second input end of the first AND gate is configured to receive a first counting control signal, and an output end of the first AND gate is coupled to an input end of the first counter; the first counting control signal is at a high level within the preset counting period; and
an output end of the first counter serves as an output end of the first counting module or is coupled to an output end of the first counting module.

4. The duty cycle calibration circuit according to claim 2, wherein the second counting module comprises a second AND gate, a second OR gate, and a second counter;
a first input end of the second AND gate is configured to receive the calibration clock signal, a second input end of the second AND gate is configured to receive the counting clock signal, and an output end of the second AND gate is coupled to a first input end of the second OR gate;
a second input end of the second OR gate is configured to receive a second counting control signal, and an output end of the second OR gate is coupled to an input end of the second counter; the second counting control signal is at a low level within the preset counting period; and
an output end of the second counter serves as an output end of the second counting module or is coupled to an output end of the second counting module.

5. The duty cycle calibration circuit according to claim 1, wherein the control unit comprises a finite state machine.

6. The duty cycle calibration circuit according to claim 1, wherein the duty cycle adjustment unit comprises:
a tune voltage providing module configured to receive a first drain voltage, and perform voltage division processing on the first drain voltage through a plurality of voltage division resistors connected in series, so as to generate the tune voltages in a plurality of gears; select and output the tune voltage in a next gear greater than the tune voltage in a current gear in a case of receiving the corresponding voltage increase control signal; and select and output the tune voltage in a next gear lower than the tune voltage in a current gear in a case of receiving the corresponding voltage decrease control signal; and
a duty cycle shaping module configured to receive a tune voltage in a corresponding gear, and adjust the duty cycle of the input clock signal through the received tune voltage in a corresponding gear.

7. The duty cycle calibration circuit according to claim 6, wherein the tune voltage providing module comprises:
a tune voltage generation sub-module configured to receive the first drain voltage, and perform voltage division processing on the first drain voltage through the plurality of voltage division resistors connected in series, so as to generate the tune voltages in a plurality of gears; and a selection and output sub-module configured to select and output the tune voltage in a nest gear greater than the tune voltage in a current gear in a case of receiving the corresponding voltage increase control signal; and select and output the tune voltage in a next gear lower than the tune voltage in a current gear in a case of receiving the corresponding voltage decrease control signal.

8. The duty cycle calibration circuit according to claim 7, wherein the tune voltage generation sub-module comprises a current source and the plurality of voltage division resistors connected in series; and a first end of the current source is configured to receive the first drain voltage, and a second end of the current source is grounded through the plurality of voltage division resistors connected in series.

9. The duty cycle calibration circuit according to claim 7, wherein the selection and output sub-module comprises a multiplexer.

10. The duty cycle calibration circuit according to claim 6, wherein the duty cycle shaping module comprises a first inverter and a second inverter;

the first inverter comprises a first P-channel metal oxide semiconductor (PMOS) transistor and a first N-channel metal oxide semiconductor (NMOS) transistor, wherein a gate end of the first PMOS transistor is coupled to a gate end of the first NMOS transistor, and serves as an input end of the duty cycle shaping module or is coupled to an input end of the duty cycle shaping module; a source end of the first PMOS transistor is configured to receive a second drain voltage, and a drain end of the first PMOS transistor is coupled to a drain end of the first NMOS transistor, and serves as an output end of the first inverter or is coupled to an output end of the first inverter; and a source end of the first NMOS transistor is grounded; and the second inverter comprises a second PMOS transistor and a second NMOS transistor, wherein a gate end of the second PMOS transistor is coupled to a gate end of the second NMOS transistor, and serves as an input end of the second inverter or is coupled to an input end of the second inverter; a source end of the second PMOS transistor is configured to receive the second drain voltage, and a drain end of the second PMOS transistor is coupled to a drain end of the second NMOS transistor, and serves as an output end of the duty cycle shaping module or is coupled to an output end of the duty cycle shaping module; and a source end of the second NMOS transistor is grounded.

11. The duty cycle calibration circuit according to claim 10, wherein the duty cycle shaping module further comprises:

a bias voltage generation sub-module configured to receive the tune voltage in a corresponding gear, and perform bias processing on the tune voltage in a corresponding gear, so as to obtain a corresponding bias voltage.

12. The duty cycle calibration circuit according to claim 11, wherein the bias voltage generation sub-module comprises a first resistor; and a first end of the first resistor is configured to receive the tune voltage in a corresponding gear, and a second end of the first resistor is coupled to the first inverter.

13. The duty cycle calibration circuit according to claim 10, wherein the duty cycle shaping module further comprises:

an alternating current coupling sub-module configured to receive the input clock signal, and perform direct current signal elimination processing on the input clock signal.

14. The duty cycle calibration circuit according to claim 13, wherein the alternating current coupling sub-module comprises a first capacitor; and a first end of the first capacitor is configured to receive the input clock signal, and a second end of the first capacitor is coupled to the first inverter.

15. The duty cycle calibration circuit according to claim 6, wherein the duty cycle shaping module comprises:

a third inverter configured to receive the input clock signal, and perform inversion processing on the input clock signal, so as to obtain an inverted input clock signal;

a first selection sub-module configured to receive a first selection control signal, and select the input clock signal or the inverted input clock signal as a selection clock signal according to the first selection control signal; wherein in a case that the duty cycle of the calibration clock signal is greater than the preset target duty cycle, the first selection control signal is logic 1; and in a case that the duty cycle of the calibration clock signal is lower than the preset target duty cycle, the first selection control signal is logic 0;

a delay sub-module configured to receive the selection clock signal and the tune voltage in a corresponding gear, and perform delay processing on the selection clock signal through the tune voltage in a corresponding gear, so as to obtain a delay clock signal;

a third OR gate configured to receive the selection clock signal and the delay clock signal, and acquire an initial calibration clock signal according to the selection clock signal and the delay clock signal; and a second selection sub-module configured to receive a second selection control signal, and select the selection clock signal and the initial calibration clock signal as the calibration clock signal according to the second selection control signal; wherein initially, the second selection control signal is logic 0; and after a logic value of the first selection control signal is acquired, the second selection control signal is logic 1.

16. The duty cycle calibration circuit according to claim 15, wherein the delay sub-module comprises: (M−1) voltage-controlled capacitors and M buffers connected in series, and M is an integer greater than 1; and a first end of each voltage-controlled capacitor is configured to receive the tune voltage in a corresponding gear, and a second end of each voltage-controlled capacitor (Cxi) is coupled to an output end of a corresponding buffer.

17. A chip, comprising the duty cycle calibration circuit according to claim 1.

18. An electronic device, comprising the chip according to claim 17.

* * * * *